US007300813B2

(12) United States Patent
Rhee et al.

(10) Patent No.: US 7,300,813 B2
(45) Date of Patent: Nov. 27, 2007

(54) METHOD FOR MANUFACTURING MICRO-MACHINED SWITCH USING PULL-UP TYPE CONTACT PAD

(75) Inventors: Jin-Koo Rhee, Seoul (KR); Seong-Dae Lee, Seoul (KR)

(73) Assignee: Dongguk University Indusrty-Academic Cooperation Foundation, Seoul (KR)

( * ) Notice: Subject to any disclaimer, the term of this patent is extended or adjusted under 35 U.S.C. 154(b) by 252 days.

(21) Appl. No.: 11/231,551

(22) Filed: Sep. 20, 2005

(65) Prior Publication Data

US 2007/0065978 A1 Mar. 22, 2007

(51) Int. Cl.
*H01L 21/00* (2006.01)

(52) U.S. Cl. ......................... 438/48; 438/456; 438/107

(58) Field of Classification Search ............ 438/48–55, 438/456, 106–107; 216/2; 257/414–415
See application file for complete search history.

(56) References Cited

U.S. PATENT DOCUMENTS

| | | | | |
|---|---|---|---|---|
| 6,621,392 | B1 | 9/2003 | Volant et al. | |
| 6,635,506 | B2 | 10/2003 | Volant et al. | |
| 6,701,779 | B2 * | 3/2004 | Volant et al. | 73/105 |
| 6,969,630 | B2 * | 11/2005 | Ozgur | 438/53 |
| 7,098,517 | B2 * | 8/2006 | Matsuo | 257/415 |

FOREIGN PATENT DOCUMENTS

| | | |
|---|---|---|
| JP | 2004006310 | 1/2004 |
| WO | WO03054938 | 7/2003 |

* cited by examiner

*Primary Examiner*—Savitri Mulpuri
(74) *Attorney, Agent, or Firm*—Darby & Darby

(57) ABSTRACT

The present invention relates to the manufacture of a semiconductor switch for use in a variety of communication systems, and particularly to the manufacture of a RF micro-machined switch of pull-up type, wherein an electrostatic electrode is used so as to cause the contact pad involved in the operation of the switch to be pulled upward from below.

The RF micro-machined switch of pull-up type according to the invention has a high isolation characteristic for shorting and opening the circuit and needs a low driving voltage, so that miniaturization of communication system is possible because a circuit for booting driving voltage is not required within the system. Further, the characteristic of switch is little changed after a long use because the metal composing the contact pad experiences little deformation during operation, whereby the semi-permanent use of switch is possible.

The present invention provides a pull-up type RF micro-machined switch, wherein the shorting of the contact pad with the transmission lines is possible with a low DC voltage by altering the conventional pull-down type electrostatic electrode into a pull-up structure and the opening of the circuit is facilitated by the weight of the contact pad by composing the contact pad in a thick metal layer.

2 Claims, 6 Drawing Sheets

METHOD FOR MANUFACTURING MICRO-MACHINED SWITCH USING PULL-UP TYPE CONTACT PAD

FIELD OF THE INVENTION

The present invention relates to a method for manufacturing semiconductor switch used in various communication systems and more particularly to a method for manufacturing a micro-machined switch employing an electrostatic electrode and a movable contact pad of pull-up type based on micro-machining technology, instead of the conventional manufacturing method using diodes, transistors etc.

BACKGROUND OF THE INVENTION

The conventional semiconductor switches manufactured by using micro-machining technology are operated on the principle that a high DC voltage is applied to thin dielectric films of $SiO_2$, $Si_3O_4$ etc., to generate electrostatic force, which causes a cantilever or contact pad as the contact means, serving as the signal path, to repeatedly switch-on or -off the signal transmitting line.

FIG. 1 shows an example of semiconductor switch based on a conventional micro-machining technology using a cantilever in pull-down form. FIG. 1(*a*) shows a micro-machined switch in parallel form and FIG. 1(*b*) shows a micro-machined switch in serial form. As appreciated from the figures, the signal transmitting line 11 and the pad 13 for application of DC voltage to move a cantilever 12 are formed separately from each other in FIG. 1(*a*), while the signal transmitting line and the pad 14 for application of DC voltage are disposed on the same line in FIG. 1(*b*).

Such conventional micro-machined switches in pull-down form based on conventional art have a high isolation characteristic between short-circuiting and circuit-opening, with little signal loss, so as to be applicable in a wide frequency range from the microwave band to a band of extremely high-frequency waves corresponding to over 30 GHz.

The conventional micro-machined switch in pull-down form, as shown in FIGS. 1(*a*) and 1(*b*), is so formed that a DC voltage, capable of causing the generation of the electrostatic force strong enough to exceed the elastic force of the metal constituting the cantilever, is applied to contact the signal transmitting lines with the cantiliver and the returning of the cantilever for disconnecting circuit is conducted by the elastic force of metal.

For the semiconductor switch developed by using conventional technology, application of a DC voltage over 20 V was required to attract the metal constituting the cantilever so as to bring the cantilever into contact with the line for transmitting signals, so that there was a problem of needing a separate circuit for raising the electric voltage for driving communication system for the purpose of application to the communication system.

In addition, there is another problem of the short using life due to the material deformation of cantilever and the low reliability on the ground that the isolation of the signal transmitting line relies on the elastic restoring force of the cantilever forming metal.

SUMMARY OF THE INVENTION

To resolve the problems with the conventional micro-machined switch as described above, the object of the present invention is intended to provide a method for manufacturing a micro-machined switch, wherein a pull-up type electrostatic electrode, this electrode being operative at below 5 V so as to be usable for communication systems and usable semi-permanently, and a contact pad instead of the cantilever is used.

The above object is achieved according to an aspect of invention by a method for manufacturing a micro-machined switch using pull-up type contact pad, comprising: the first step of laminating the both surfaces of silicon substrate with silicon oxide or silicon nitride films to prevent the loss of signal to the interior of the silicon substrate; the second step of metal wiring process for forming signal transmitting lines and pull-up electrode on the underside of the substrate so treated; the third step of laminating a dielectric film on said electrode to generate the electrostatic force for driving contact pad and of etching; the fourth step of forming contact pad and guide-poles for realizing stable operation of the contact pad, partially by using a plating process; the fifth step of forming a groove in a cover glass plate for the purpose of preventing the loss of said contact pad and maintaining a constant distance between the contact pad and the signal transmitting lines; the sixth step of forming extended transmission lines for measurement and application of DC voltage on the cover glass plate through metal wiring process; the seventh step of joining the glass plate with the silicon substrate by using bi-pole joining process after aligning the patterns contained between the glass plate and the silicon substrate; and the eighth step of etching the silicon substrate to expose the pads or lines for measurement and for application of DC voltage for the purpose of measurement and application of DC voltage. In the present invention, the shorting of the contact pad with the transmission lines are possible at a low DC voltage by constructing the contact pad in pull-up structure and the opening of the circuit can be facilitated by the relatively large weight of the contact pad by composing the contact pad in a thick metal form.

DETAILED DESCRIPTION OF THE INVENTION

The characteristic construction and operative effect of the invention are described in detail below by referring to the accompanying drawings.

Figure 1:
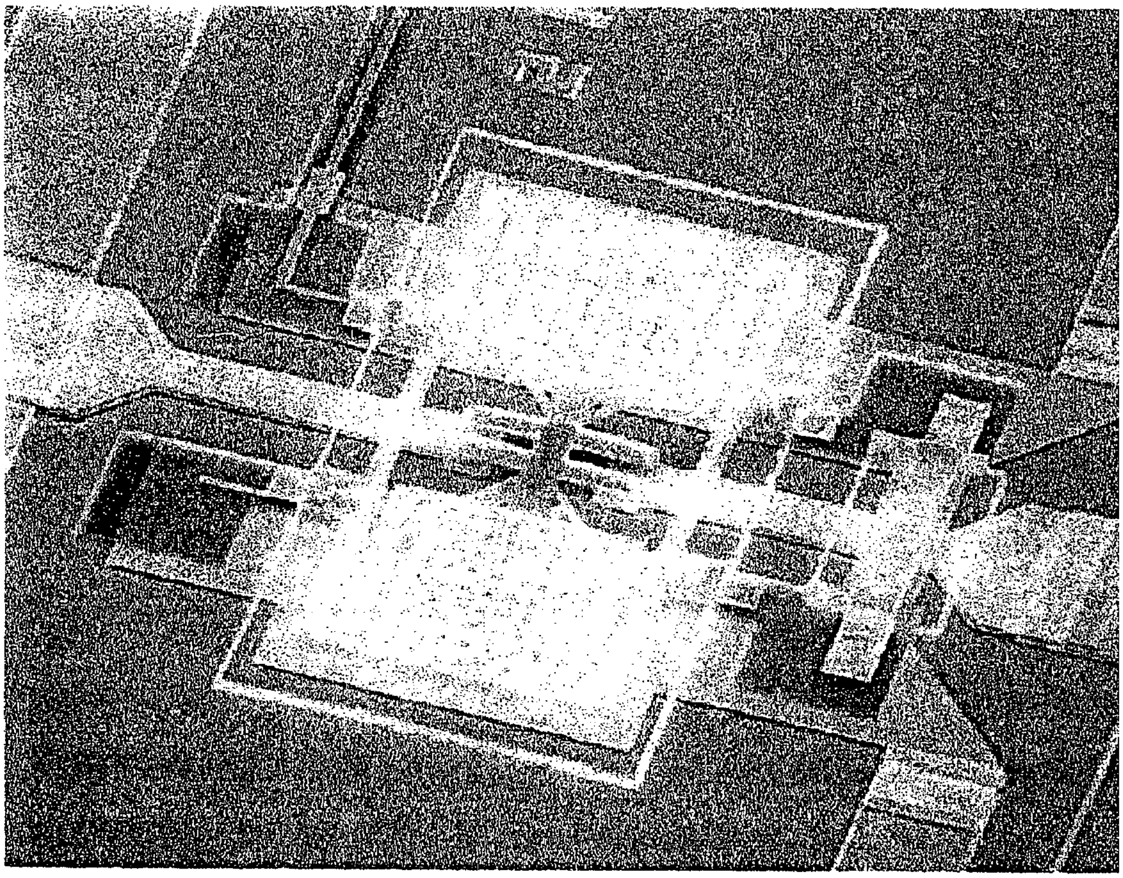
FIG. 1 shows a conventional micro-machined switch using a pull-down type cantilever, wherein FIG. 1(*a*) shows a parallel type micro-machined switch, FIG. 1(*b*) shows a serial type micro-machined switch.
Figure 1A:
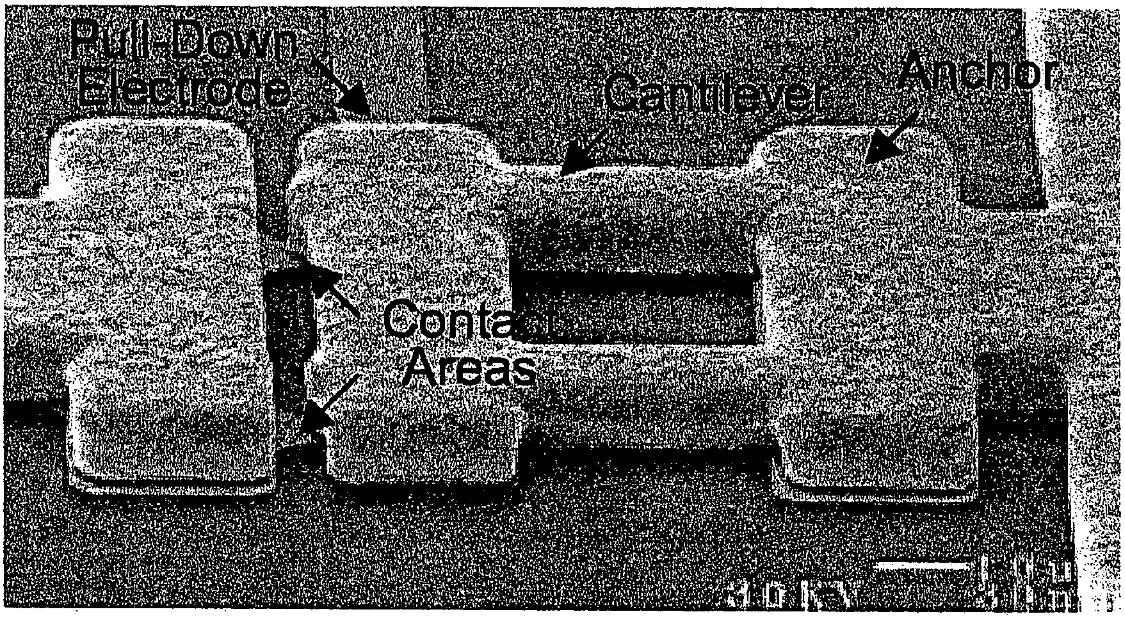
Figure 1B:
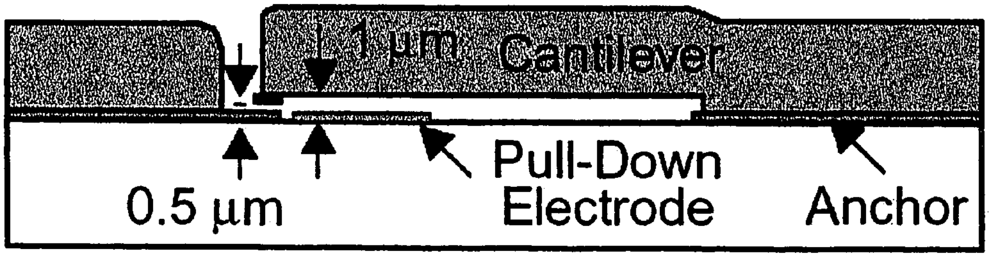
Figure 2A:
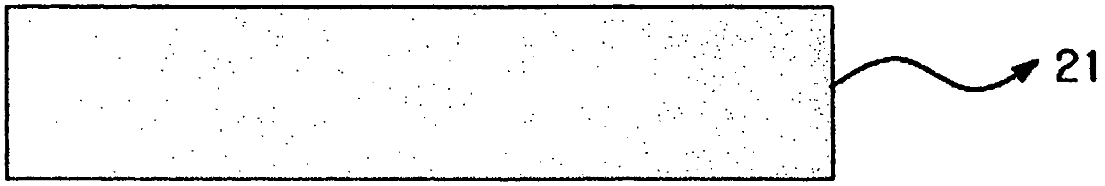
FIG. 2 shows the sequential steps of the process for manufacturing a micro-machined switch using a pull-up type contact pad according to the invention, wherein FIG. 2(*a*) shows a silicon substrate, FIG. 2(*b*) shows the lamination of silicon nitride films on the both surfaces of silicon substrate, FIG. 2(*c*) shows the formation of wirings including signal transmitting lines and pull-up electrode, FIG. 2(*d*) shows the lamination of dielectric film for driving contact pad and etching, FIG. 2(*e*) shows the formation of a contact pad and guard-poles, FIG. 2(*f*) shows the formation of a groove on the glass plate to cover the contact pad, FIG. 2(*g*) shows the formation of extended transmission lines on the glass plate, FIG. 2(*h*) shows the joining of the silicon substrate with the glass plate by using bi-pole joining process, FIG. 2(*i*) shows the etching of the silicon substrate for partially exposing the pads for measurement and application of DC voltage.
Figure 2B:
Figure 2C:
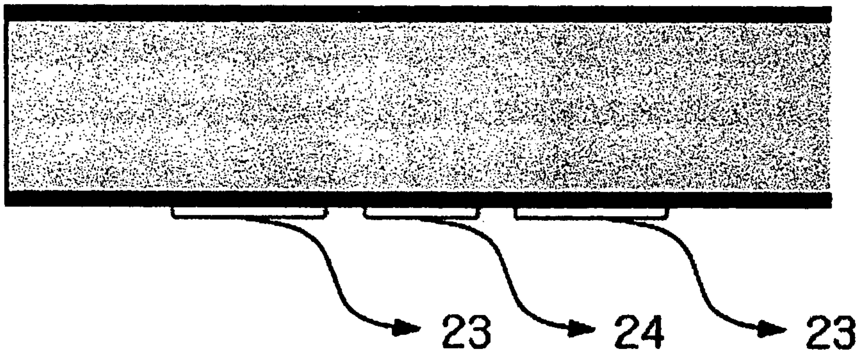
Figure 2D:
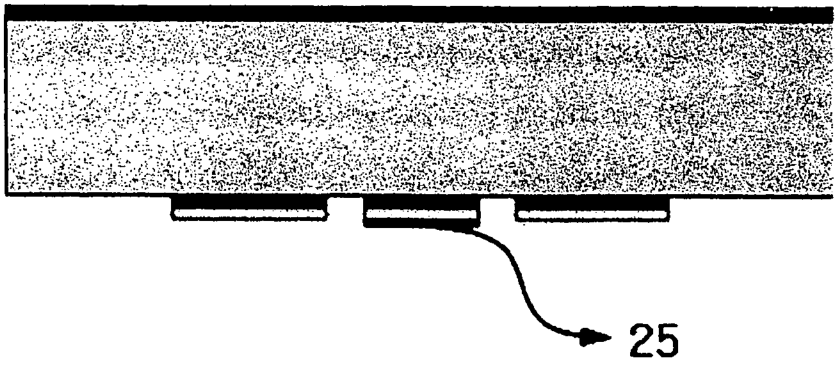
Figure 2E:
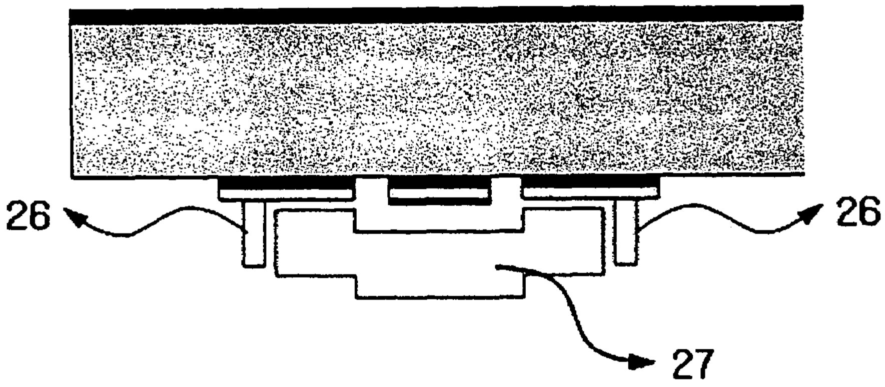
Figure 2F:
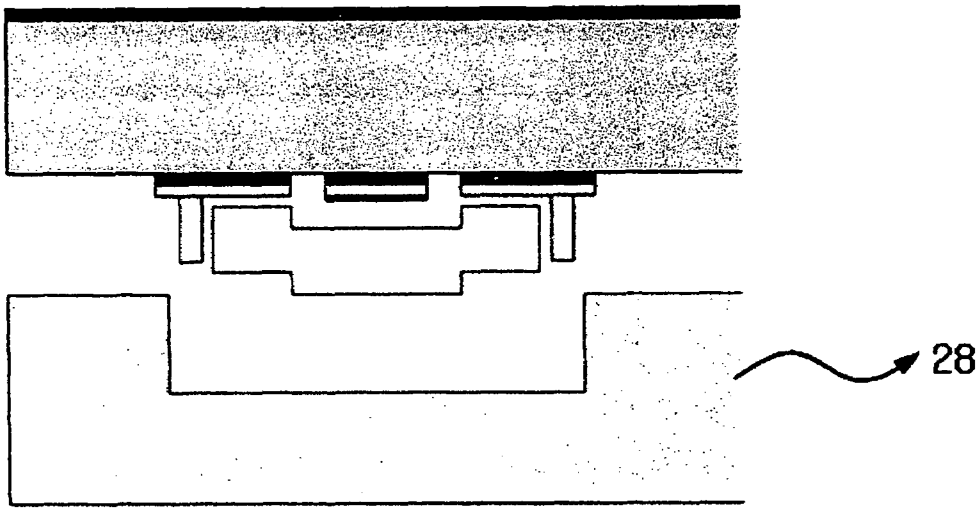
Figure 2G:
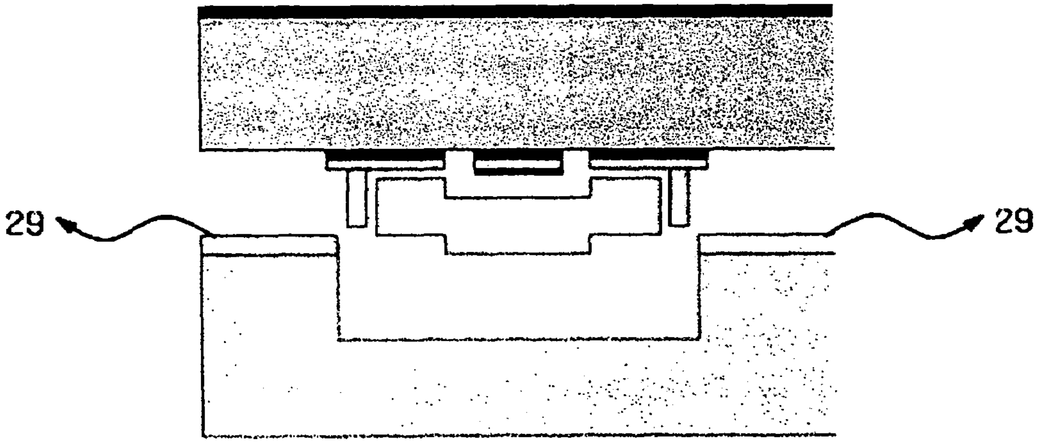
Figure 2H:
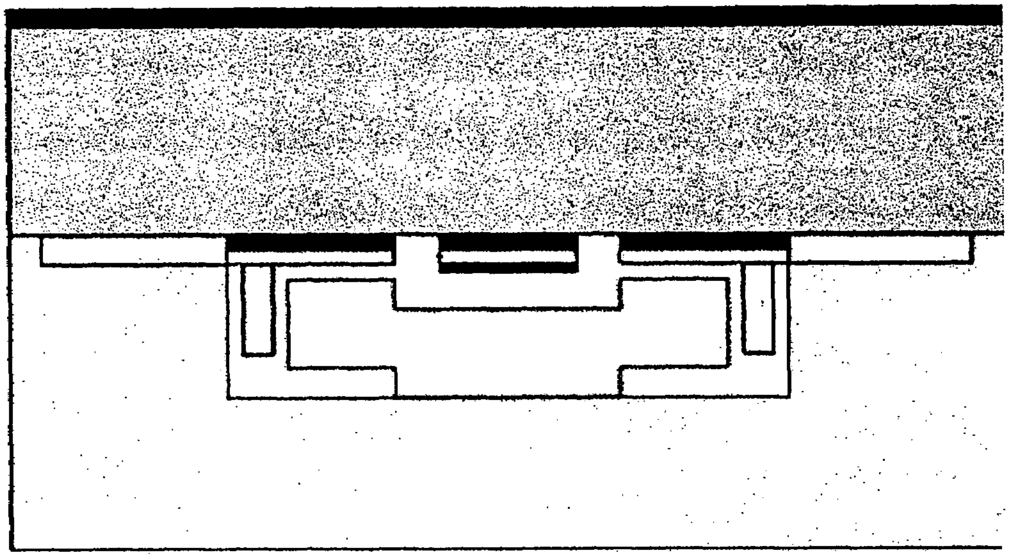
Figure 2I:
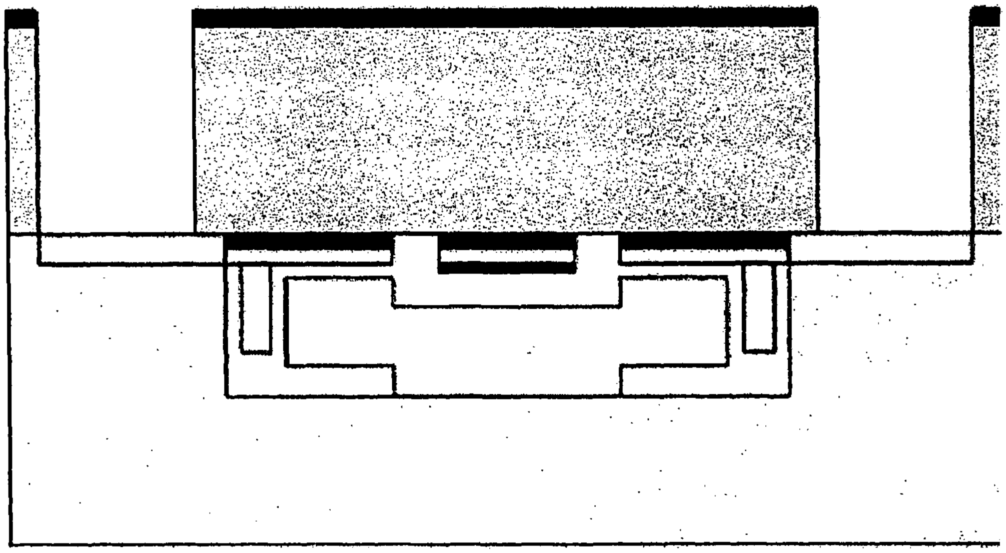

FIG. 1 shows an example of conventional semiconductor switch with cantilever in pull-down form based on the micro-machined technology, wherein FIG. 1(*a*) shows a micro-machined switch in parallel form and FIG. 1(*b*) shows a micro-machined switch in serial form. FIG. 2 shows the sequence of processing a micro-machined switch by using a pull-up type pad according to the invention. FIG. 1(*a*) shows a silicon substrate 21; and FIG. 1(*b*) shows the first step of manufacturing process, in which the silicon substrate 21 shown in FIG. 2(*a*) is laminated, on its both surfaces, with films of silicon oxide or silicon nitride 22 to prevent the transmission loss of signal to the interior of silicon substrate 21. Ordinary silicon substrates have low electric resistance due to the considerably high impurity content, so that signal loss toward the substrate would be possible if a signal passes through a transmission line, which was directly formed on the substrate. Therefore, any signal loss to a substrate can be prevented by growing silicon oxide films or silicon nitride films on both surfaces of silicon substrate before the process of forming metal wirings on the substrate. As the silicon oxide film used in the first step, silicon dioxide($SiO_2$) is used, and $Si_3N_4$ can be used for the representative nitride film. These silicon oxide and silicon nitride are laminated by using the thermal oxidation or chemical vapor deposition method or the like.

FIG. 2(*c*) shows the second step of process, in which metal wiring is carried out for forming signal transmitting lines 23 and a pull-up electrode 24 on the underside of the substrate 21 having silicon oxide or silicon nitride films laminated, wherein the metal wirings are formed by using the sputtering or evaporation method or the like after forming patterns by using the silk-screen printing or photosensitive film method.

FIG. 2(*d*) shows the third step of the process in which laminating a dielectric film 25 for generating the electrostatic force to drive the contact pad is formed on the electrode 24 and etching are then conducted. As the dielectric film for generating the electrostatic force, silicon oxide and silicon nitride may be used. Such dielectric thin films can be easily laminated by using the chemical deposition process and can be easily etched into a desired pattern. As the etching method, the dry etching method using gases or plasma is predominantly used, wherein the gases based on fluorine such as hexafluorosulfur($SF_6$), trifluoromethane ($CHF_3$), hexafluoroehane($C_2F_6$) and tetrafluorosilicon($SiF_4$) may be used, as the gas for the dry etching. In the case of wet etching, the etching solution based on the hydrofluoric acid (HF) is preferably used. In the processing step for etching dielectric films for generating the electrostatic force, the etching for a sufficiently long period is conducted, so that the silicon oxide or silicon nitride films 22 on the all areas of the underside of substrate 21, except for the areas where the metal wirings are formed, are etched. The areas where the silicon oxide or silicon nitride films were removed become the areas brought into joining with the glass plate in the later seventh step for bi-pole joining.

FIG. 2(*e*) shows the fourth step, in which a contact pad 27 and guard poles 26 for realizing stable operation of the contact pad are processed by using the plating method, the contact pad being manufactured in a pull-up form instead of the conventional pull-down form.

The following characteristics are realized in the case that the pad is made in a pull-up form:

First, the contact pad can be driven even with a low DC voltage. While in the case of the pull-down type contact pad according to the conventional art, the contact pad was driven only when an electrostatic force exceeding the elastic force of the contact pad made of metal is applied, the contact pad according to the invention requires only a low driving voltage because an electrostatic force just large enough to exceed the gravitational force equivalent to the weight of contact load is required.

Second, the inventive contact pad is not attached to a substrate contrary to the conventional switch but of construction independent from the substrate. As the result, the contact pad is not easily deformed over a long time of use, so that the semi-permanent use of contact pad is possible.

Third, the contact and detachment of the movable contact pad and the contact pad of opposite polarity depend on the weight of the movable contact pad. The voltage to drive a contact pad will be low as the weight of the pad is decreased but the detachment of contact pad becomes difficult. On the other hand, when the pad is heavy, there is another disadvantage of the driving voltage getting high, even with the merit of easy opening. Accordingly, the contact pad preferably has the structure of metal layer with the thickness large enough to secure the pad weight for shorting and opening the signal transmitting line.

FIG. 2(*f*) shows the fifth stage of the process, in which a cover glass plate 28 for preventing the loss of the contact pad and for maintaining a constant distance between the contact pad and the signal transmitting lines is formed with a groove. The etching of the glass is conducted by using the hydrofluoric acid, and the etching depth for the groove is determined by taking into consideration the thickness of the contact pad after forming later the conductors, the desired distance between the signal transmitting lines and the contact pad and the thickness of the signal transmitting line films.

FIG. 2(*g*) shows the sixth step of the process in which extended transmitting lines 29 for measurement and application of DC voltage are formed on the glass plate through a metal-wiring process. The extended electrodes are formed by using the sputtering or evaporation method or the like after forming the desired patterns through a printing process or photosensitive filming process.

FIG. 2(*h*) shows the seventh step of the process for joining the glass plate with the silicon substrate through a bi-pole joining method after aligning the patterns in the space between the glass plate and the silicon substrate. The bi-pole joining method is a kind of joining method for joining a semiconductor substrate like the silicon substrate or gallium-arsenic(Ga—As) with a same semiconductor substrate or with other substrate of glass etc. For the present invention, silicon substrate and glass plates are joined by using the bi-pole joining method in order to support the contact pad and to maintain a constant gap between the contact pad and the silicon substrate.

FIG. 2(*i*) shows the eighth step of the process for etching the silicon substrate for access to the pads for measurement and application of DC-voltage. Only the necessary portion of silicon substrate can be etched with a high selectivity by using a dry or wet etching method after pattern alignment. The dry etching process is conducted by using either the gases based on fluorine such as hexafluorosulfur($SF_6$), trifluoromethane($CHF_3$), hexafluoroehane($C_2F_6$) and tetrafluorosilicon($SiF_4$) or the gases based on chlorine such as chlorine($Cl_2$), trichloroboron($BCl_3$) and tetrachlorosilicon ($SiCl_4$) may be used. The wet etching process is conducted by using the anisotropic etching solution based on kalium-hydroxide(KOH), TMAH(trimethylammoniumhydroxide) or the like. Whereas the dry method results in nearly vertical sharp-edged etching surfaces compared to the wet method, it is associated with the problem of producing rougher surfaces than by the wet etching method.

Figure 3:
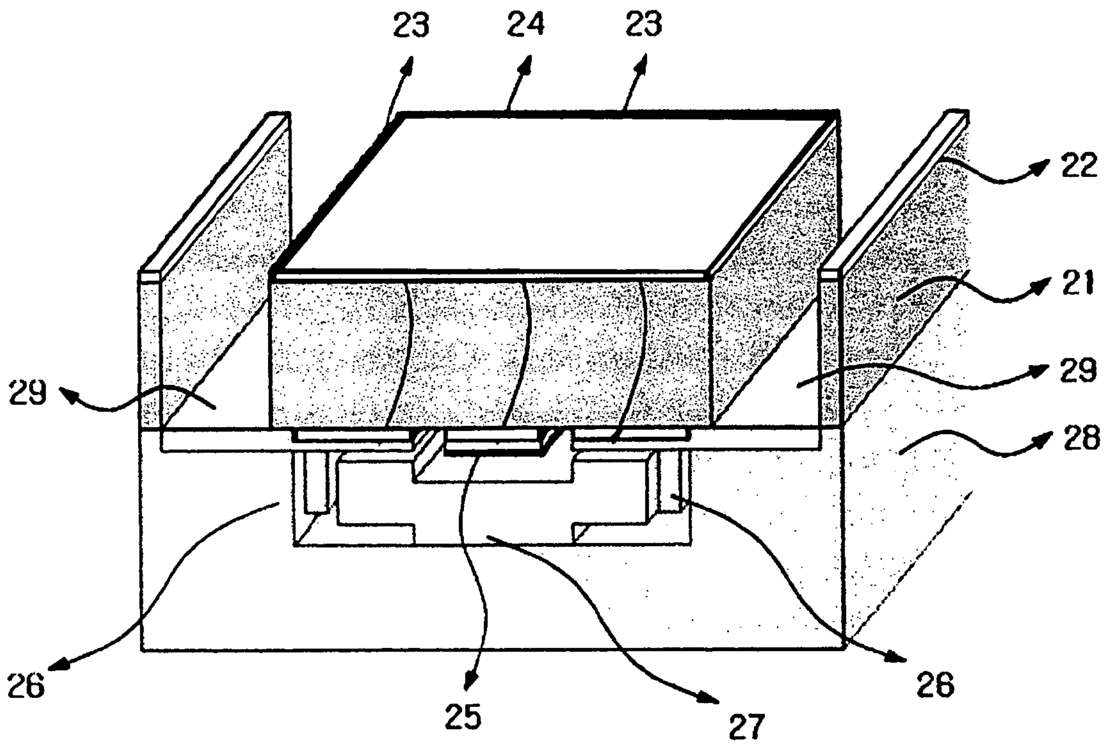
FIG. 3 shows the view of the structure for a micro-machined switch using a pull-up type contact pad according to the invention.

FIG. 3 shows the view of the construction of a micro-machined switch according to the invention, employing a pull-up type contact pad, wherein the contact pad 27 is constructed as a unit independent from the silicon substrate 21.

In FIG. 3, the signal is transmitted through the contact pad of the extended signal transmitting lines of the glass plate with the signal transmitting lines of the substrate, when the contact pad 27 is pulled up to contact the isolated transmitting lines 23. Driving the contact pad 27 is achieved by applying a DC voltage.

The micro-machined switch using a pull-up type contact pad according to the invention has a high isolation characteristic for shorting and opening the circuit and needs a low driving voltage, so that miniaturization of communication system is possible because a circuit for booting driving voltage is not required within the system.

Further, the characteristic of switch is little changed after a long use because the metal composing the contact pad experiences little deformation during operation, making the semi-permanent use of switch possible.

The invention claimed is:

1. A method for manufacturing a micro-machined switch using pull-up type contact pad, comprising:

the first step of laminating the both surfaces of silicon substrate (21) with silicon oxide or silicon nitride films (22) to prevent the loss of signal to the interior of the silicon substrate (21);

the second step of metal wiring process for forming signal transmitting lines (23) and pull-up electrode (24) on the underside of the substrate (21) so treated;

the third step of laminating a dielectric film (25) on said electrode (24) to generate the electrostatic force for driving contact pad (27) and of etching;

the fourth step of forming contact pad (27) and guide-poles (26) for realizing stable operation of the contact pad (27), partially by using a plating process;

the fifth step of forming a groove in a cover glass plate (28) for the purpose of preventing the loss of said contact pad (27) and maintaining a constant distance between the contact pad (27) and the signal transmitting lines (23);

the sixth step of forming extended transmission lines (29) for measurement and application of DC voltage on the cover glass plate (28) through metal wiring process;

the seventh step of joining the glass plate (28) with the silicon substrate (21) by using bi-pole joining process after aligning the patterns contained between the glass plate and the silicon substrate; and the eighth step of etching the silicon substrate to expose the pads or lines for measurement and for application of DC voltage for the purpose of measurement and application of DC voltage.

2. The method for manufacturing a micro-machined switch using pull-up type contact pad according to claim 1, wherein the contact pad (27) in said fourth step has the structure of metal layer with the thickness large enough to secure the pad weight for shorting and opening the signal transmitting line.

* * * * *

UNITED STATES PATENT AND TRADEMARK OFFICE

CERTIFICATE OF CORRECTION

PATENT NO. : 7,300,813 B2
APPLICATION NO. : 11/231551
DATED : November 27, 2007
INVENTOR(S) : Jin-Koo Rhee et al.

It is certified that error appears in the above-identified patent and that said Letters Patent is hereby corrected as shown below:

Title Page, Item (73) Assignee:

Please delete “Dongguk University Indusrty-Academic cooperation Foundation” and insert -- Dongguk University Industry-Academic Cooperation Foundation --.

Signed and Sealed this

Twenty-fifth Day of March, 2008

JON W. DUDAS
*Director of the United States Patent and Trademark Office*